(12) United States Patent
Wang et al.

(10) Patent No.: US 7,871,909 B1
(45) Date of Patent: Jan. 18, 2011

(54) METHODS OF USING SINGLE SPACER TO TRIPLE LINE/SPACE FREQUENCY

(75) Inventors: Chun-Ming Wang, Fremont, CA (US); Chen-Che Huang, Campbell, CA (US); Masaaki Higashitani, Cupertino, CA (US); George Matamis, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/689,677

(22) Filed: Jan. 19, 2010

(51) Int. Cl.
*H01L 21/3205* (2006.01)
*H01L 21/44* (2006.01)

(52) U.S. Cl. .................. 438/584; 438/585; 438/595; 438/671; 438/947; 257/E21.023; 257/E21.027

(58) Field of Classification Search .......... 438/584, 438/585, 595, 947, 669, 671; 257/E21.027, 257/E21.023
See application file for complete search history.

(56) References Cited

U.S. PATENT DOCUMENTS

| | | | |
|---|---|---|---|
| 6,103,605 A * | 8/2000 | Hopper | 438/585 |
| 6,867,116 B1 * | 3/2005 | Chung | 438/551 |
| 6,955,961 B1 * | 10/2005 | Chung | 438/241 |
| 7,358,140 B2 * | 4/2008 | Furukawa et al. | 438/266 |
| 7,611,980 B2 * | 11/2009 | Wells et al. | 438/597 |

* cited by examiner

*Primary Examiner*—Michael Trinh
(74) *Attorney, Agent, or Firm*—Vierra Magen Marcus & DeNiro LLP

(57) ABSTRACT

Methods for forming patterns having triple the line frequency of a first pattern using only a single spacer are disclosed. For example, the first pattern is formed in a first and a second material using a lithographic process. Sidewall spacers are formed from a third material adjacent to exposed sidewalls of features in the second material. The width of the features in the first pattern in the first material is reduced. For example, the width is reduced to about the target width of features in a final pattern. The width of features in the first pattern in the second material is reduced using remaining portions of the first material as a mask. A second pattern is formed based on remaining portions of the second material and the sidewall spacers. The features in the second pattern may be lines having about ⅓ the width of lines in the first pattern.

20 Claims, 10 Drawing Sheets

METHODS OF USING SINGLE SPACER TO TRIPLE LINE/SPACE FREQUENCY

BACKGROUND

1. Field

Embodiments of the present disclosure are directed to high density semiconductor devices, such as non-volatile memory, and methods of forming the same.

2. Description of the Related Art

As the size of electronic devices continue to decrease, there is continual pressure to shrink the substrate area required to implement the various integrated circuit functions. Semiconductor memory devices, for example, and the fabrication processes therefore are continuously evolving to meet demands for increases in the amount of digital data that can be stored in a given area of a silicon substrate. Such demands stem from a desire to increase the storage capacity within a memory card while maintaining or even decreasing the card form factor.

As demands for higher densities in integrated circuit applications have increased, fabrication processes have evolved to reduce the minimum feature sizes of circuit elements such as the gate and channel regions of transistors. For example, Choi et al., "Sublithographic Nanofabrication Technology for Nanocatalysts and DNA Chips," J. Vac. Sci. Technol. B 21(6), November/December 2003, pp. 2951-2955, describes an iterative spacer lithography technique which multiplies the pattern density in an integrated circuit to achieve an element width and a corresponding space therebetween that is smaller than a minimum definable lithographic feature size. Such decreases in the sizes of circuit elements, as well as other considerations, increase the need for precision in fabrication processes and integrity in resulting materials.

It is desirable that the process form features whose width are within design tolerances. Also, the space between the features should be within design tolerances. Typically, the term critical dimension (CD) variation refers to the variation of the width and space from target values. It is desirable to have little CD variation.

It is desirable that the process form features whose locations are within design tolerance. For purposes of discussion, the location of a feature can be considered to be its center with respect to a cross section. For example, for the cross section of a line having a width "W", the center is at the midpoint of the cross section. For a group of parallel lines, it may be desirable that the center of each line be located at regular intervals. Typically, the term overlay variation refers to the variation of the location of each feature. It is desirable to have low overlay variation.

DETAILED DESCRIPTION

Embodiments can be used in the formation of numerous types of high density semiconductor devices. In some embodiments, the line frequency of a first pattern is tripled with a fabrication process that uses only a single spacer. For example, the first pattern is formed using a lithographic process. A final pattern that has three times as many lines as the first pattern is fabricated by using a single spacer, along with other process steps. The lines in the final pattern may have about ⅓ the width of the lines in the first pattern.

While not so limited, the described techniques can achieve feature sizes that are smaller than the smallest lithographically resolvable feature size of the process being used. This can facilitate the high density formation of numerous types of elements in integrated semiconductor device fabrication. The CD variation of features formed using embodiments disclosed herein may be kept within tight tolerances. The overlay variation of features formed using embodiments disclosed herein may be kept within tight tolerances.

As one example, embodiments herein may be used to form features in NAND flash memory architecture. As another example, embodiments herein may be used to form features in 3D memory architectures. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays.

Figure 1A:
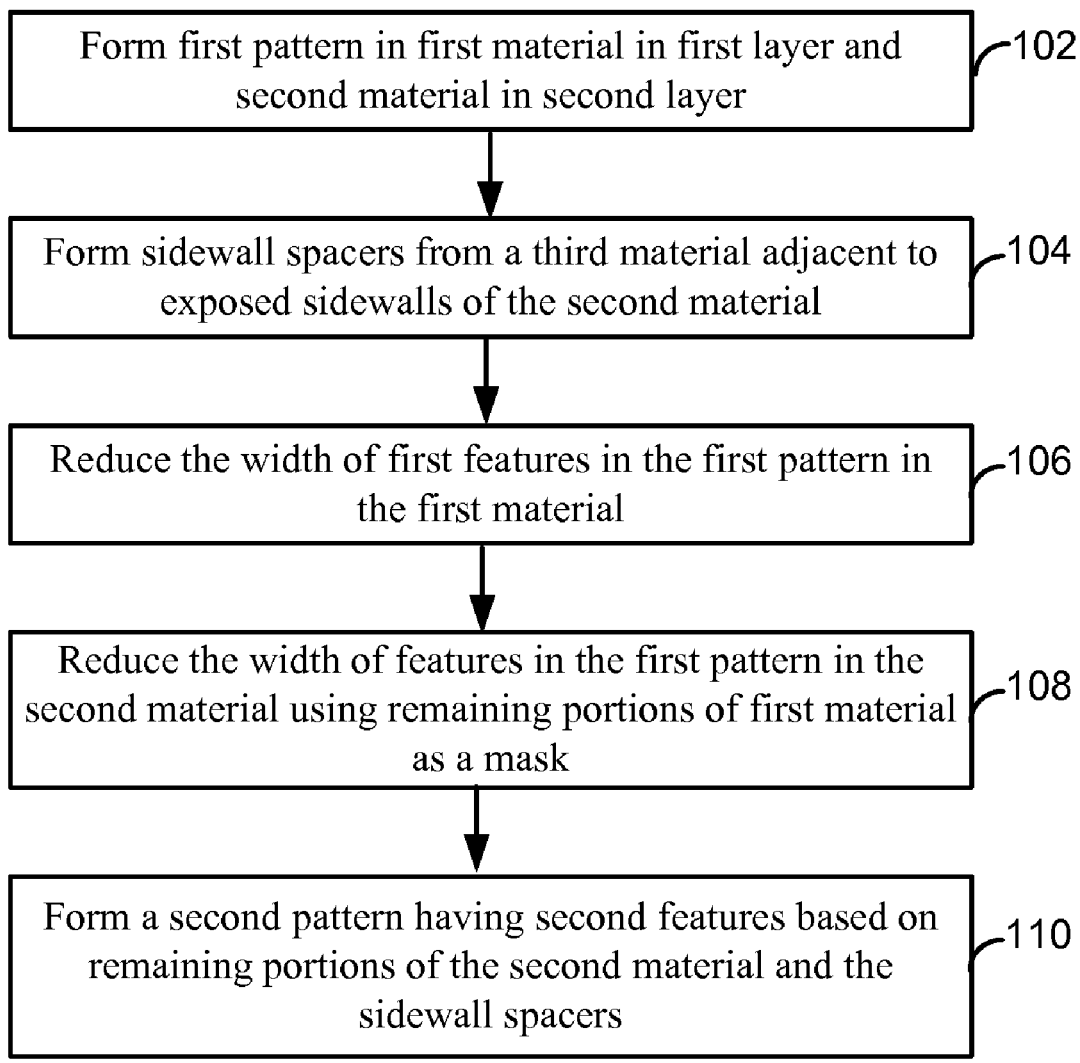
FIG. 1A is a flowchart illustrating steps of a process of formation of features in accordance with one embodiment.
Figure 1B:
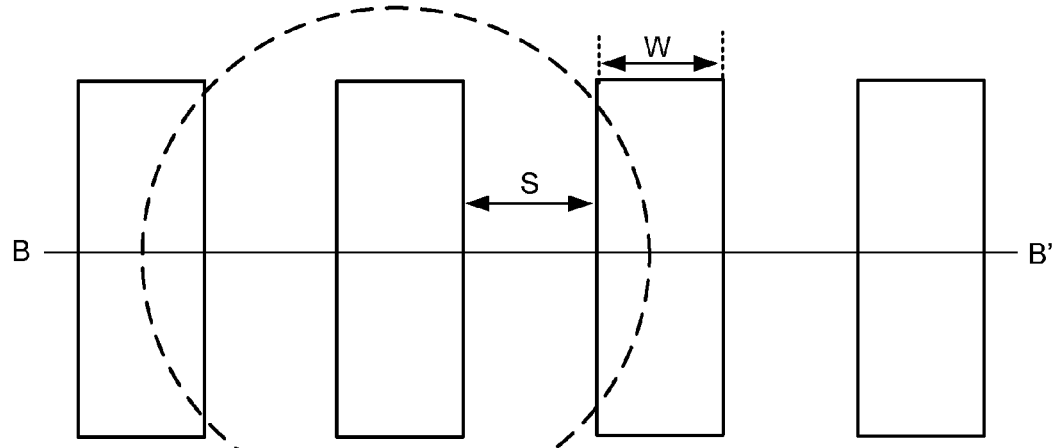
FIG. 1B depicts a top view of a portion of an example first pattern that may be formed during the process of FIG. 1A.
Figure 1C:
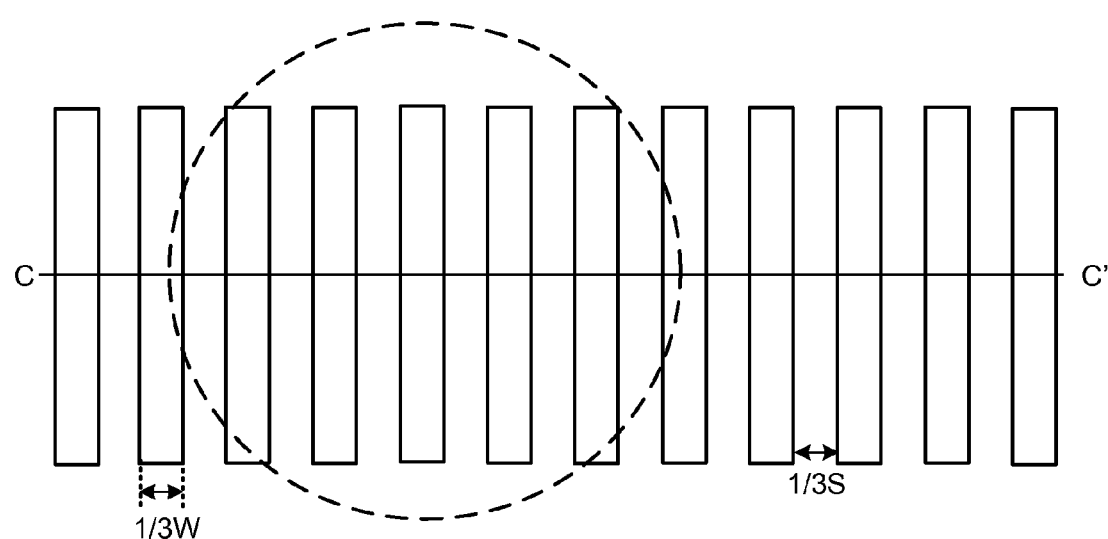
FIG. 1C depicts a top view of an example final pattern that may be formed during the process of FIG. 1A.

FIG. 1A is a flowchart illustrating steps of a process 100 of formation of features in accordance with one embodiment. FIG. 1B depicts a top view of a portion of an example first pattern that may be formed during process 100. FIG. 1C depicts a top view of an example final pattern that is formed during process 100. Note that the final pattern has three times as many lines (or triple the frequency) of the first pattern. In this example, the width of the lines in the final pattern is ⅓ the width of the lines in the first pattern; however, the process is not so limited. In this example, the width of the spaces between the lines in the final pattern is ⅓ the width of the spaces in the first pattern; however, the process is not so limited. In this example, the patterns are parallel lines, such as word lines or bit lines in a NAND or 3D memory. However, the features are not limited to lines. FIGS. 3C, 3E, 3F, 3G, 3K, and 3L depict formation of features using one embodiment of process 100 to highlight select portions of process 100. Various other steps known to those of ordinary skill in the art are omitted for conciseness of explanation of the disclosed principles. Modifications to the disclosed process can be made in other implementations as will be appreciated.

In step 102, a first pattern is formed. The first pattern may have first features such as lines, although the first features are not required to be lines. As one example, the lines could be word lines in a NAND memory. As another example, the lines could be word lines or bit lines in a 3D memory architecture. In one embodiment, during a later step a final pattern is formed that has three lines for each line in the first pattern. The lines in the final pattern may have a pitch that is about ⅓ the pitch of lines in the first pattern. The first pattern may be formed in a first material in a first layer and in a second material in a second layer.

Figure 3A:
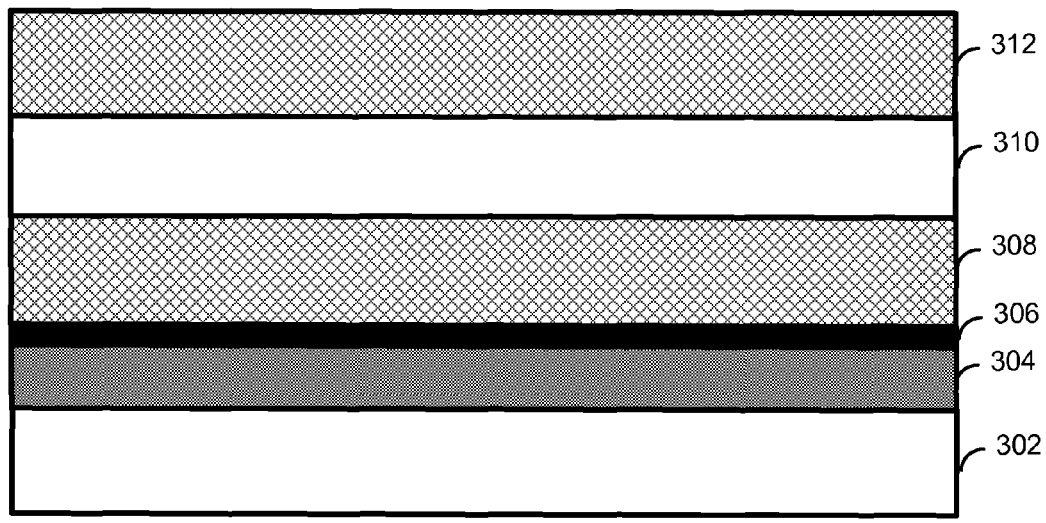
FIGS. 3A-3L depict formation of features at various steps during a fabrication.
Figure 3B:
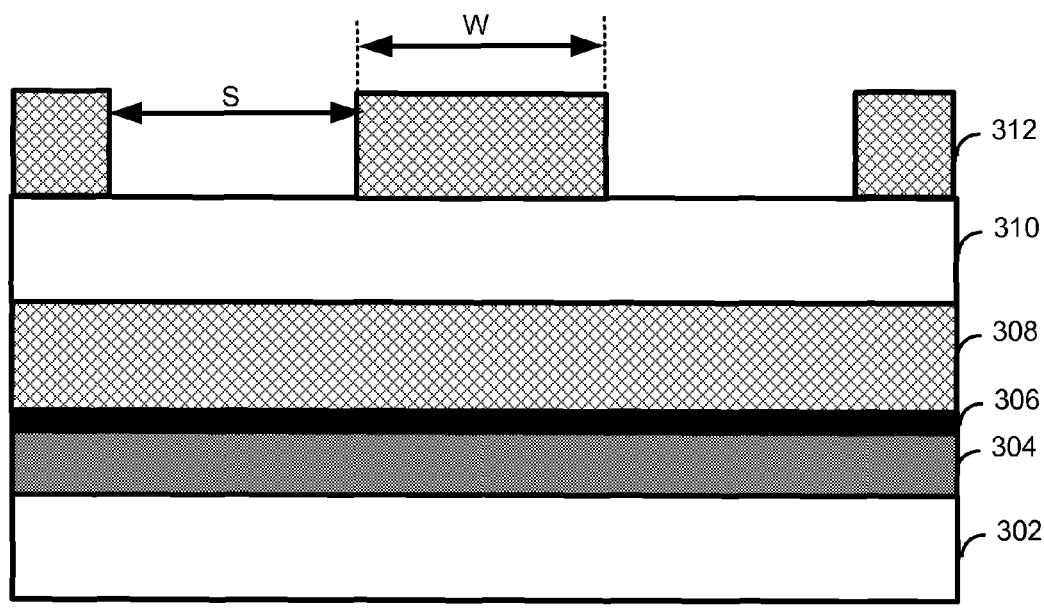
Figure 3C:
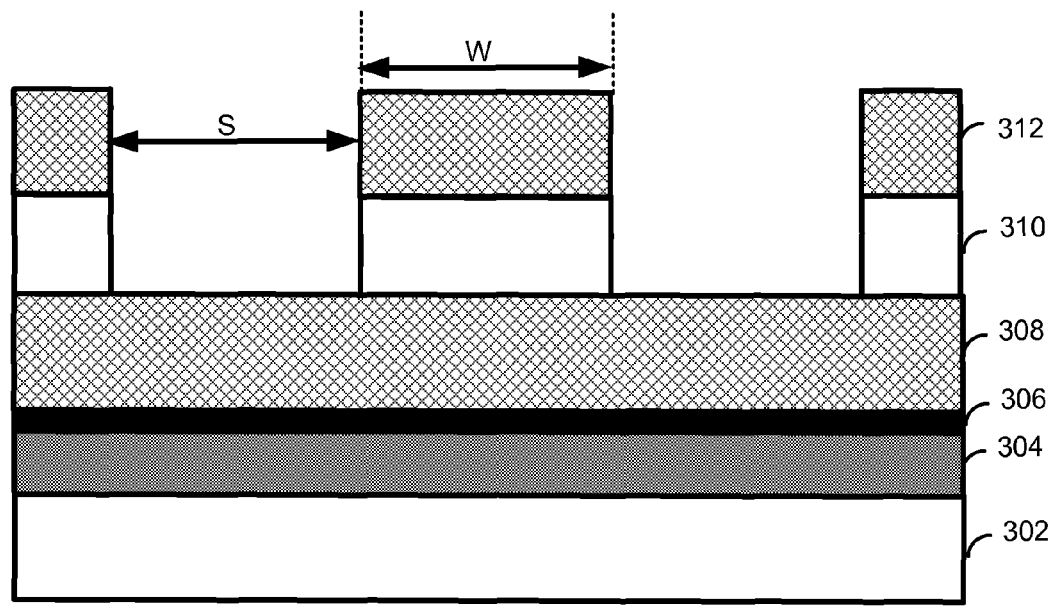

In one embodiment, the first material in the first layer has an etch selectivity with respect to the second material in the second layer. For example, the first material may be amorphous carbon and the second material may be polysilicon. FIG. 3C depicts an example of results after step 102. Specifically, FIG. 3C depicts a first pattern formed in the two topmost layers with several other layers below. FIG. 3C is a cross sectional view along lines B-B' of FIG. 1B. However, note that FIG. 3C only shows the portion of FIG. 1B within the dashed circle, and thus shows fewer lines than FIG. 1B. In this example, the first pattern includes lines having a width "W" and spaces "S" between the lines. In one embodiment, "W" is approximately equal to "S," but that is not required. Further details of an embodiment of forming the first pattern are discussed below.

Figure 3D:
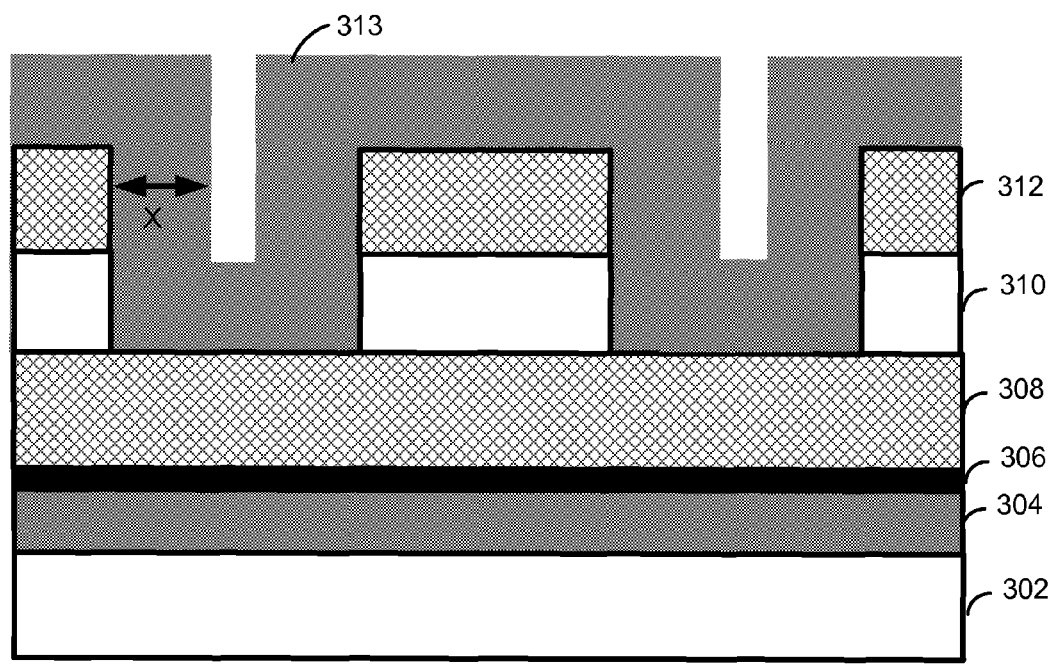
Figure 3E:
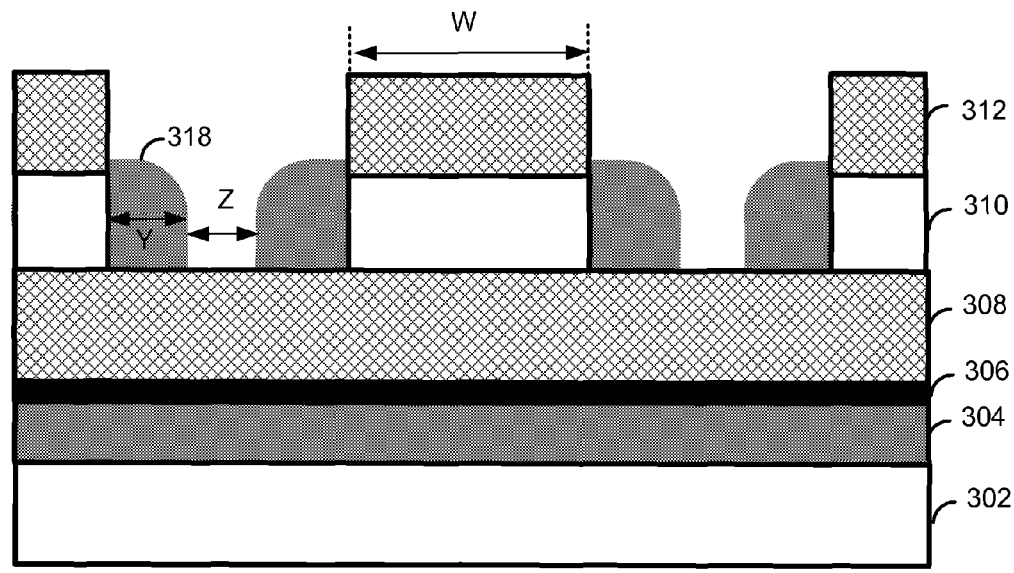

In step 104, sidewall spacers are formed from a third material on exposed sidewalls of the second material. In one embodiment, the sidewall spacers are formed from a third material that has an etch selectivity with respect to both the first material and the second material. For example, the sidewall spacers may be formed from silicon nitride, which may have an etch selectivity with respect to both amorphous carbon and polysilicon. FIG. 3E depicts results after step 104 in which sidewall spacers 318 are formed at least on the second material in the second layer 310.

In one embodiment, the sidewall spacers 318 will provide part of the basis for forming some (but not all) of the features in the final pattern. As an example, the final pattern may contain three times as many lines as the first pattern. The sidewall spacers 318 may serve as the basis for two thirds of the lines in the final pattern. Note that each sidewall spacer 318 may be used when etching one or more layers below the sidewall spacers 318. Then, one or more of the lower layers may be used when forming the final pattern. At this point, the sidewall spacers 318 may have a width of "Y." In some embodiments, "Y" is somewhat larger than ⅓W to allow for some further narrowing of the sidewall spacers 318 prior to using the sidewall spacers 318 as a mask to etch lower layers. Note that the gap (Z) between the sidewall spacers 318 may be somewhat less than ⅓W at this time, but may increase to about ⅓W by the time the sidewall spacers 318 are used as a mask. Further details of an embodiment of forming the sidewall spacers 318 are discussed below.

Figure 3F:
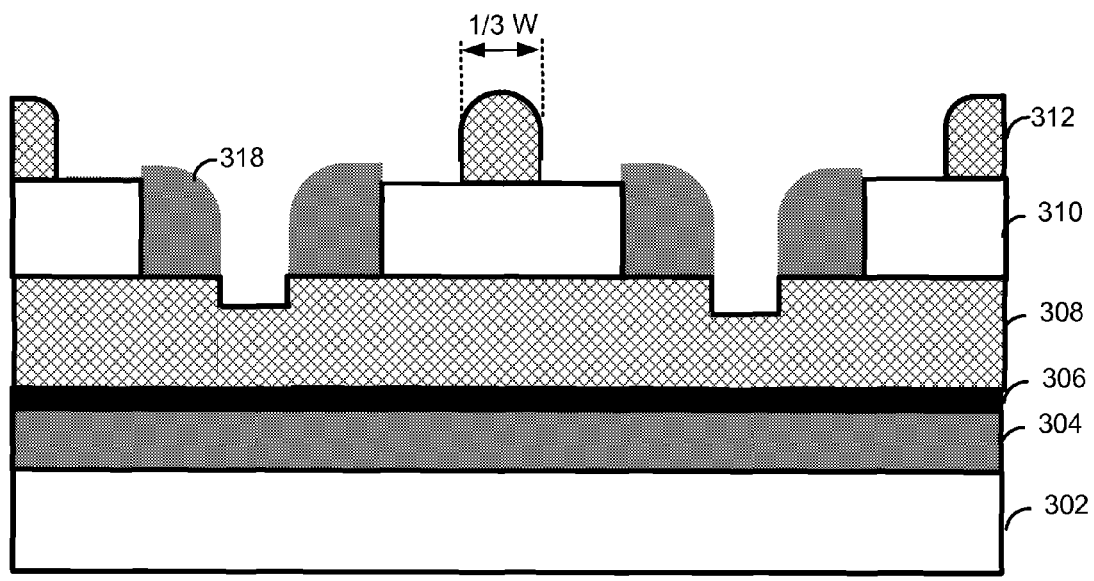

In step 106, the width of features of the first pattern in the first material is reduced. Note that the number of lines in the first material is not altered. Thus, the pitch of the lines in the first material in the first layer 312 may remain about the same. However, the width of the lines may be about ⅓ the width of the original lines in the first pattern. Note that the width of the lines after step 106 may be more or less than ⅓ the width of the lines in the first pattern. In one embodiment, step 106 includes reducing the width of features in the first material in the first layer 312. FIG. 3F depicts results after one embodiment of step 106.

Figure 3G:
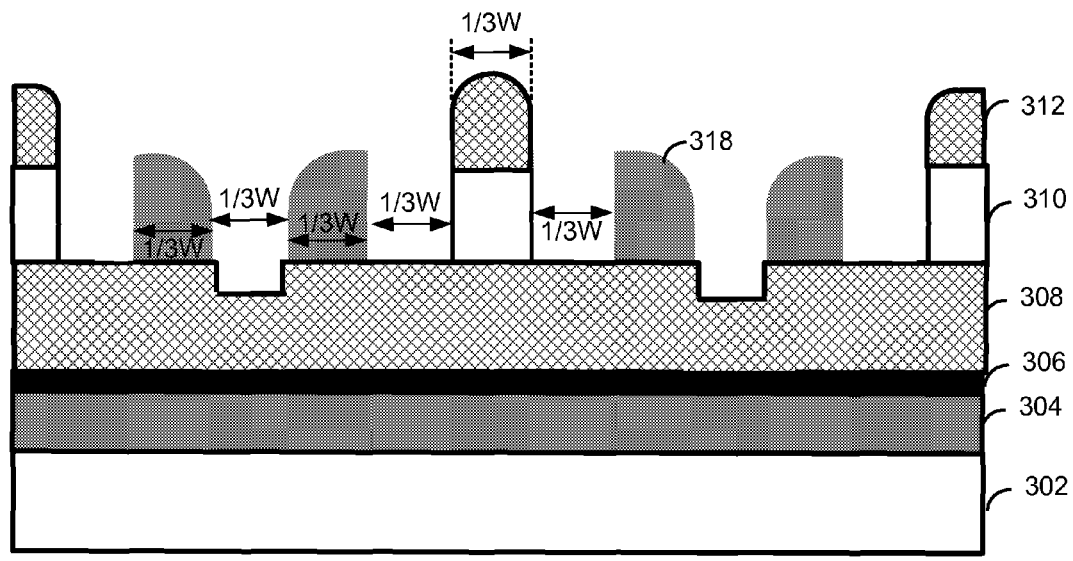

In step 108, the width of features in the second material in the second layer 310 is reduced. In one embodiment, step 108 includes etching the second material based on the first material. FIG. 3G depicts results after one embodiment of step 108. In one embodiment, the lines in the second material in the second layer 310 will provide part of the basis for forming some (but not all) of the features in the final pattern. As an example, the final pattern may contain three times as many lines as the first pattern. The lines in the second material (after step 108) may serve as the basis for one third of the lines in the final pattern. Thus, together, the sidewall spacers 318 and the lines in the second material may serve as the basis for all of the lines in the final pattern. Note that each line in the second material may be used when etching one or more layers below. Then, one or more of the lower layers may be used when forming the final pattern.

Figure 3H:
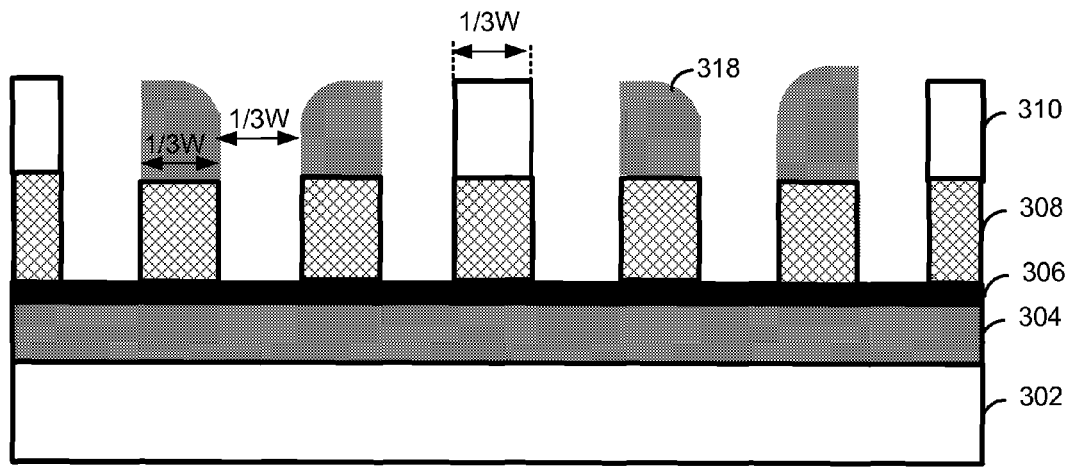
Figure 3I:
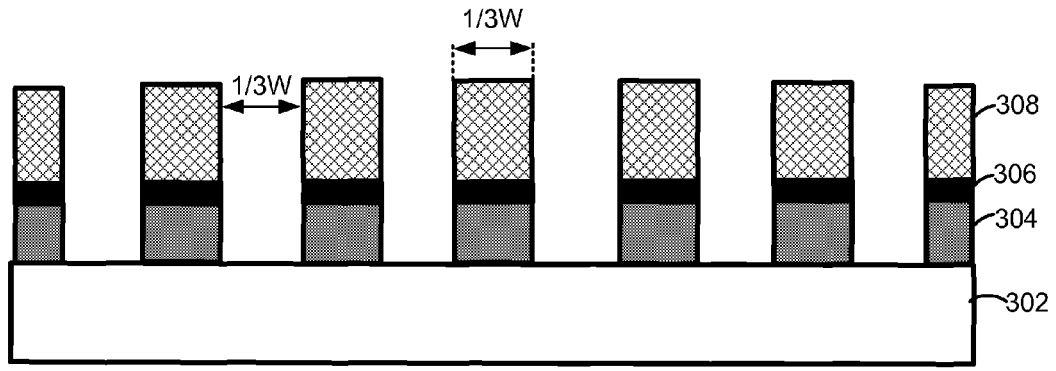
Figure 3J:
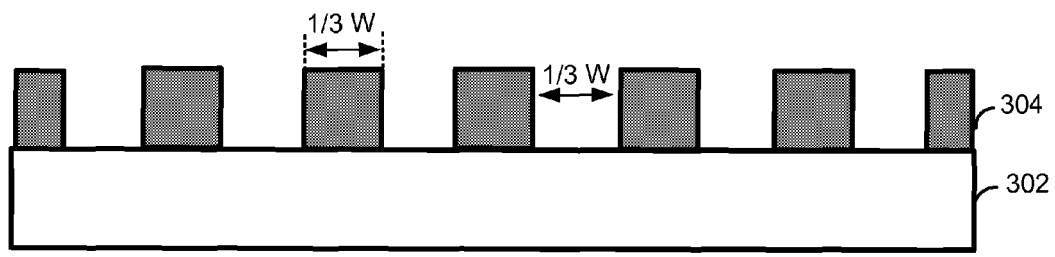
Figure 3K:
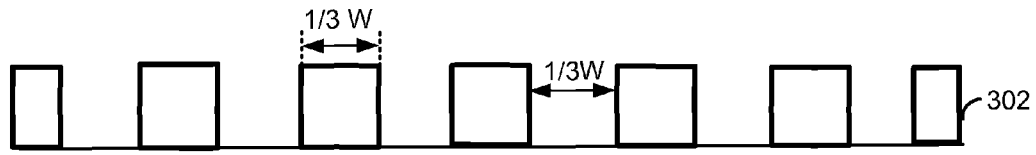
Figure 3L:
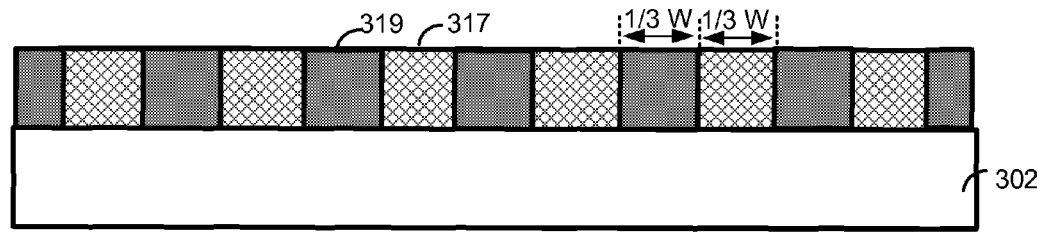

In step 110, features are formed in the final pattern based on the lines in the second material and the sidewall spacers. Note that step 110 may include etching one or more layers below the second material and the sidewall spacers 318 to form an intermediate pattern prior to forming the final pattern. For example, a first intermediate pattern may be formed in a layer 308 of amorphous carbon. Then, using the intermediate pattern in the amorphous carbon, a second intermediate pattern may be formed in a layer 304 of silicon nitride. Then, the final pattern may be formed based on the intermediate pattern in the silicon nitride. FIG. 3K depicts one example of a final pattern. FIG. 3K shows a side sectional view along line C-C' of FIG. 1C. However, note that FIG. 3K only shows the portion of FIG. 1C within the dashed circle, and thus shows fewer lines than FIG. 1C. FIG. 3L depicts another example of a final pattern in which metal lines 317 are formed with an insulator 319 between the lines. Note that in this example, the location of the metal lines 317 corresponds to the location of the spaces in the final pattern of FIG. 3K. Further details of forming the final pattern are discussed below.

Figure 2:
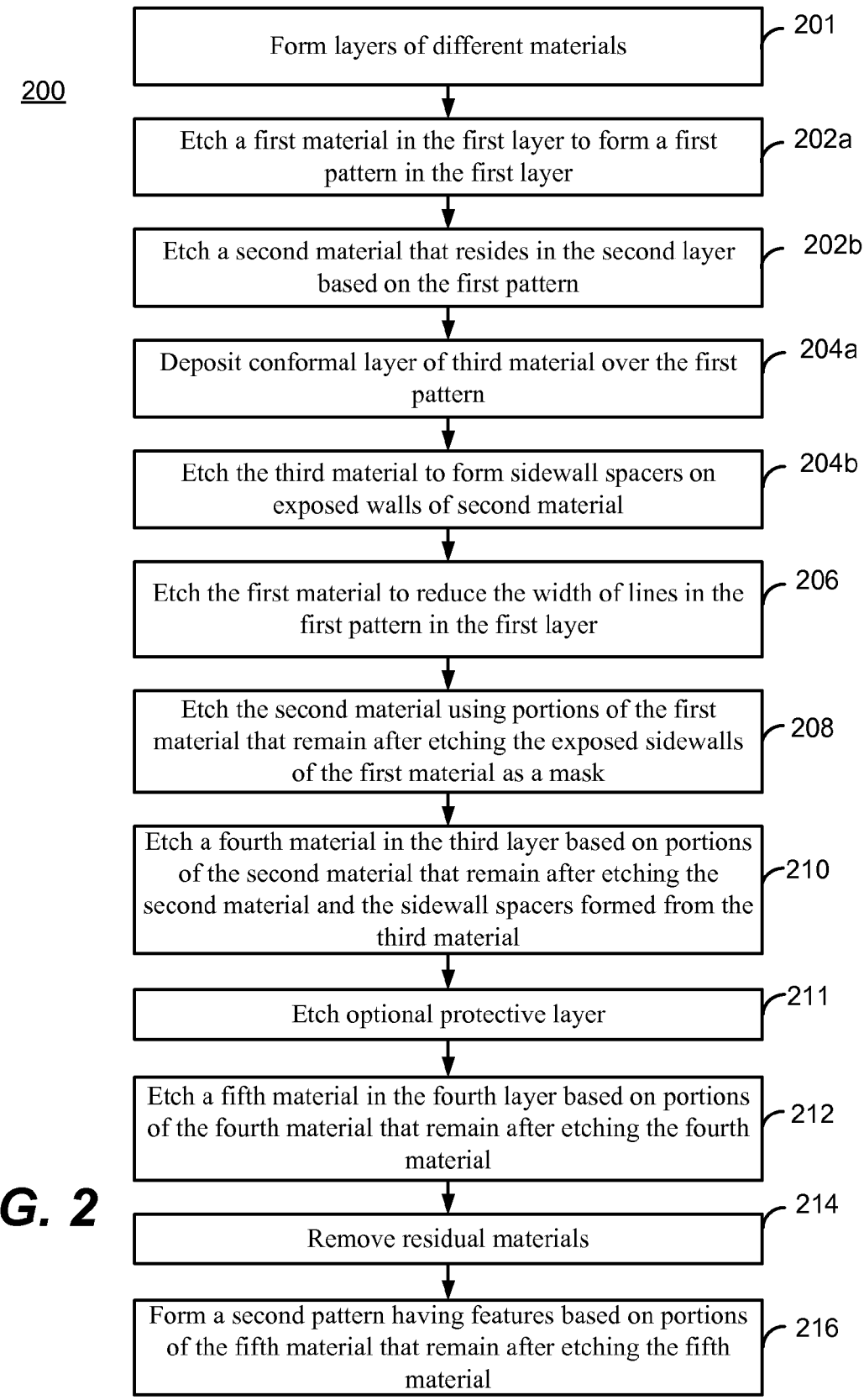
FIG. 2 is a flowchart of one embodiment of a process of forming features.

FIG. 2 is a flowchart of a process 200 of forming features. The process 200 provides additional details to the process of FIG. 1. FIGS. 3A-3L depict formation of features using one embodiment of process 200 to highlight select portions of process 200. Various other steps known to those of ordinary skill in the art are omitted for conciseness of explanation of the disclosed principles. Modifications to the disclosed process can be made in other implementations as will be appreciated.

In step 201, various layers of different materials are formed. FIG. 3A depicts various layers of materials. For purposes of discussion, the topmost layer will be referred to as a first layer 312. The different layers includes first layer 312, second layer 310, third layer 308, protective layer 306, fourth layer 304, and fifth layer 302. The protective layer is optional. The materials in at least some of the different layers may have different etch selectivities such that the material in one layer may be selectively removed without removing significant portions of materials in another layer.

In one embodiment, the material in the first layer 312 has an etch selectivity with respect to the material in the second layer 310. Likewise, the material in the first layer 312 may have an etch selectivity with respect to the material in the fourth layer 304. However, note that it is not required for the material in the first layer 312 to have an etch selectivity with respect to the material in the third layer 308. In one embodiment, the first layer 312 and third layer 308 are formed from the same material. However, note that is not required that the material in the first layer 312 have the same etch selectivity as the material in the third layer 308. The material in the second layer 310 may have an etch selectivity with respect to the material in the third layer 308. Further, the material in the second layer 310 may have an etch selectivity with respect to the material in the fourth layer 304. Further, the material in the third layer 308 may have an etch selectivity with respect to the material in the fourth layer 304.

In one embodiment, the first layer 312 has a thickness of about 800 Angstroms, the second layer 310 has a thickness of about 800 Angstroms, and the third layer 308 has a thickness of about 400 Angstroms. However, each of these layers 312, 310, 308 may have a greater or lesser thickness. The various layers can be deposited using known chemical vapor deposition (CVD) processes, metal organic CVD processes, physical vapor deposition (PVD) processes, atomic layer deposition (ALD) processes, grown using a thermal oxidation process, or formed using another suitable process.

In one embodiment, the first layer 312 includes amorphous carbon, the second layer 310 includes polysilicon, the third layer 308 includes amorphous carbon, and the fourth layer 304 includes silicon nitride. Note that amorphous carbon may have an etch selectivity with respect to polysilicon, amorphous carbon may have an etch selectivity with respect to silicon nitride, and polysilicon may have an etch selectivity with respect to silicon nitride. Note that if all three of these materials are exposed to the same etching, one material may be selectively removed without removing significant portions of the other materials. The fifth layer 302 may be, for example, polysilicon. In one embodiment, the fifth layer 302 is used to form features such as control gates in a NAND memory array.

In step 202a, a first material is etched to form a first pattern in the first layer 312. For example, amorphous carbon in the first layer 312 is etched to form a first pattern that includes first features. The first pattern may include lines, but that is not a requirement. In one embodiment, the lines in the first pattern have a pitch that is three times the pitch of lines in the final pattern to be formed. In one embodiment, the lines in the first pattern have a width that is three times the width of lines in the final pattern. In one embodiment, the features in the first pattern are the smallest features that can be formed with the lithographical process that is in use. However, the features in the first pattern are not required to be the smallest features that can be formed with the lithographical process that is in use.

Forming the first pattern may include depositing a hardmask layer over the first layer 312. The hardmask layer exhibits high selectivity but is easily removed. In embodiments, the hardmask may be formed of SiN or SiON, and may be applied by deposition methods as described above or as known in the art. After the hard mask has been formed, a photoresist layer is then depositing over the hardmask layer. The photoresist may then be developed as known in the art to form a pattern in the photoresist. The pattern in the photoresist may then be transferred to the hardmask layer. Next, the material in the first layer (e.g., amorphous carbon) is etched to transfer the pattern in the hard mask to the first layer 312. The hard mask and any remaining photoresist are then removed. FIG. 3B depicts results after step 202a. In this example, the first pattern includes lines having a width "W" with spaces "S" between the lines. In one embodiment, W is equal to S. However, the spaces can be wider or narrower than the width of the lines. In one embodiment, W is the smallest feature size that can be formed given the limitations of the lithographic process in use. However, W may be greater than the smallest feature size that can be formed given the limitations of the lithographic process in use. The first pattern in the first material in layer 312 is a side sectional view of a portion of the first pattern in FIG. 1B. Note that fewer lines are shown in FIG. 3B for simplicity.

In step 202b, a second material in the second layer 310 is etched based on the first pattern in the first material in the first layer 312. Therefore, the first pattern is transferred from the first layer 312 to the second layer 310. For example, amorphous carbon in the first layer 312 is used as a mask to form the first pattern in polysilicon in the second layer 310. FIG. 3C depicts results after step 202b. Note that polysilicon has an etch selectivity with respect to amorphous carbon. Therefore, the amorphous carbon in the first layer 312 may not be significantly affected when etching the polysilicon in the second layer 310. Furthermore, amorphous carbon in the third layer 308 may not be significantly affected when etching the polysilicon in the second layer 310. Thus, the amorphous carbon in the third layer 308 may serve as an etch stop layer. Note that it is not an absolute requirement that amorphous carbon be used in the third layer 308. However, the material in the third layer 308 should have an etch selectivity with respect to the material in the second layer 310. As will be discussed below, the materials in the first, second, and third layers may also have an etch selectivity with another material. In one embodiment, that other material is silicon nitride. FIG. 3C depicts results after step 202b. Note that steps 202a and 202b are one implementation of step 102 of the process of FIG. 1.

In steps 204a and 204b, sidewall spacers 318 are formed on exposed sidewalls of the material in the second layer 310. In one embodiment, the sidewall spacers 318 are formed from a third material that has an etch selectivity with respect to both the first material of the first layer 312 and the second material of the second layer 310. For example, the sidewall spacers 318 may be formed from silicon nitride, which may have an etch selectivity with respect to both amorphous carbon and polysilicon. Note that silicon nitride may also be used in the fourth layer 304. Thus, in this example, the material used to form the sidewall spacers 318 does not have an etch selectivity with respect to the material in the fourth layer 304. However, note that this is not a requirement.

Forming the sidewall spacers 318 may be achieved by first depositing a conformal layer over the first pattern in the first layer 312 and second layer 310 in step 204a. Deposition may be by low pressure chemical vapor deposition (LPCVD), but other techniques may be used. For example, LPCVD may be used to form a conformal layer of silicon nitride ($Si_3N_4$). The conformal layer may have a substantially uniform thickness on at least the exposed sidewalls of the second material. FIG. 3D depicts results after depositing a conformal layer 313 over the first pattern. The conformal layer 313 covers first exposed sidewalls of the first material of the first layer 312 and second exposed sidewalls of the second material of the second layer 310. The conformal layer has a width "X" in this example. In one embodiment, the thickness (X) is somewhat greater than ⅓ the width (W) of the features in the first and second layers 312, 310. Note that later process steps may result in the thickness of the material on the sidewalls being reduced. In one embodiment, the value of X is targeted such that eventually, the thickness of the material on the sidewalls will be reduced to about ⅓W. As an example, W may be 51 nanometers (nm), whereas X may be 22 nm. Note that X could be more or less than 22 nm given that W is 51 nm. Also, note that W may be greater or less than 51 nm.

Next, in step 204b, conformal layer of the third material is etched to form sidewall spacers 318 from the conformal layer. Etching the conformal layer may not significantly alter the first material in the first layer 312 or the second material in the second layer 310. In one embodiment, a dry etching process such reactive ion etching is used. However, it is not required that reactive ion etching be used. FIG. 3E depicts results after step 204. Note that the sidewall spacers 318 are not required to cover any of the first sidewalls of the first material of the first layer 312, although the sidewall spacers 318 may do so. Also note that is not an absolute requirement that the sidewall spacers 318 cover the entire exposed second sidewalls of the second material of the second layer 310, but they may do so.

The process of etching the third material that forms that conformal layer 313 may narrow the width of the portion of the conformal layer that is adjacent to the sidewalls. For example, etching could narrow the width of the conformal layer on the second sidewalls of the second material in the second layer 310 from X down to Y. For example, the width may be reduced from about 22 nm to about 19 nm, as a result of the etching. After the etching there will be a space having a width "Z" between the sidewall spacers. In one embodiment, Z is somewhat less than ⅓W. For example, if the spacers are each 19 nm, then Z may be about 13 nm (assuming that W and S are each 51 nm).

The sidewall spacers 318 may be used to form features that have a width that is about ⅓*W during a later step. Therefore, at this step, the width of the sidewall spacers 318 may be somewhat greater than ⅓W to allow for some further slimming of the sidewall spacers 318. Note that if it is not expected that the width of the sidewall spacers 318 will be significantly reduced prior to using them as a mask to form the final features, then the sidewall spacers 318 could be about ⅓W at this time. Note that steps 204a and 204b are one implementation of step 104 of the process of FIG. 1.

In step 206, the first material in the first layer 312 is etched to slim the width of features in the first material. Referring to FIGS. 3E and 3F, the width (W) of features in the first material in the first layer 312 may be reduced to about one third of their former width. However, note that the width of features could be greater or less than one third the original width of features in the first pattern. Note that slimming the features in the first material in the first layer may result in loss of some of the material in the third layer 308. This is because the third layer 308 may be formed from the same material from which the first layer 312 is formed. However, the loss of some material in the third layer 308 will not be detrimental. Also note that there may be some reduction of height of the first material in the first layer 312. However, this loss is not detrimental.

In one embodiment, the first material in the first layer 312 is amorphous carbon. Amorphous carbon may be etched by using an oxygen etch. This may result in some rounding of the tops of lines in the first layer 312, as shown in FIG. 3F. Note that step 206 of FIG. 2 is one implementation of step 106 of FIG. 1.

In step 208, the second material in the second layer 310 is etched using portions of the first material that remain as a mask. This results in transferring what remains of the first pattern in the first material to the second material and is one implementation of step 108 of FIG. 1. FIG. 3G depicts results after step 208. Note that because the second material has an etch selectivity with respect to the first material (of the first layer 312 and third layer 308) the first material may not be significantly impacted by etching the second material. Therefore, the width of the features in the first layer may remain at about ⅓W.

In one embodiment, etching the second material causes some reduction of the width of the third material that forms the sidewall spacers 318. For example, the width of the sidewall spacers 318 may be reduced from about 19 nm to about 17 nm. The amount of reduction, if any, may depend on the etch selectivity between the second material and the third material. For example, etching polysilicon (second material) might impact silicon nitride (third material) to some extent. As previously discussed, the depth of the conformal layer that was deposited in step 204a can be adjusted for expected reduction in the sidewall spacers 318 due to etching other materials.

After step 208, the width of the lines in the second layer 310 may be about ⅓W. Also note that there may be a gap of about ⅓W between the lines in the second layer 310 and the sidewall spacers 318. As discussed, the sidewall spacers 318 may have a width of ⅓W. Finally, the gap between pairs of sidewall spacers 318 may be ⅓W. Such a formation may be suitable for later forming lines having a width of ⅓W in a pattern with triple the frequency as the first pattern.

In step 210, a fourth material in the third layer 308 is etched based on portions of the second material that remain after etching the second material and the sidewall spacers 318 formed from the third material. FIG. 3H depicts result after step 210. In one embodiment, the fourth material is the same material as the first material in the first layer 312. For example, the first and fourth materials are amorphous carbon. Note that the fourth material should have an etch selectivity with respect to both the second and third materials. Therefore, the fourth material may be the same material as the first material, but this is not a requirement.

In optional step 211, the optional protective layer 306 is etched based on portions of the fourth material that remain after etching the fourth material. The protective layer 306 may be used to prevent possible damage to the fifth material in the fourth layer 304 during previous process steps. However, use of the protective layer 306 is not required. The protective layer 306 may be formed from $SiO_2$, Ti, or TiN.

In step 212, a fifth material in the fourth layer 304 is etched based on portions of the fourth material that remain after etching the fourth material. In one embodiment, the fifth material is the same material as the sidewall spacers 318, although this is not required. For example, the fifth material may be silicon nitride. Note that the fifth material should have an etch selectivity with respect to the fourth material. This way, the intermediate pattern in the fourth material may be transferred to the fifth material. For example, silicon nitride (fifth material) may have an etch selectivity with respect to amorphous carbon (fourth material). FIG. 3I depicts result after step 212. Note that the sidewall spacers 318 may be etched away while etching the fifth material. If there is any of the second material from the second layer 310 remaining the second material may be removed, but that is not a requirement. The second material is shown as removed in FIG. 3I.

In step 214 residual materials are removed. For example, remaining portions of the fourth material in the third layer 308 and the protective layer 306 are removed, leaving the final pattern in the fifth material. FIG. 3J depicts results after step 214. The remaining material in the fourth layer 304 may serve as a final pattern that may be used to form the final features.

In step 216, features are formed based on portions of the fifth material that remain in the fourth layer 304. For example, the material in layer 302 may be etched using the final pattern as a mask. As another example, metal lines could be formed within gaps in the final pattern. Further details of forming features are discussed in connection with FIGS. 4A and 4B.

Figure 4A:
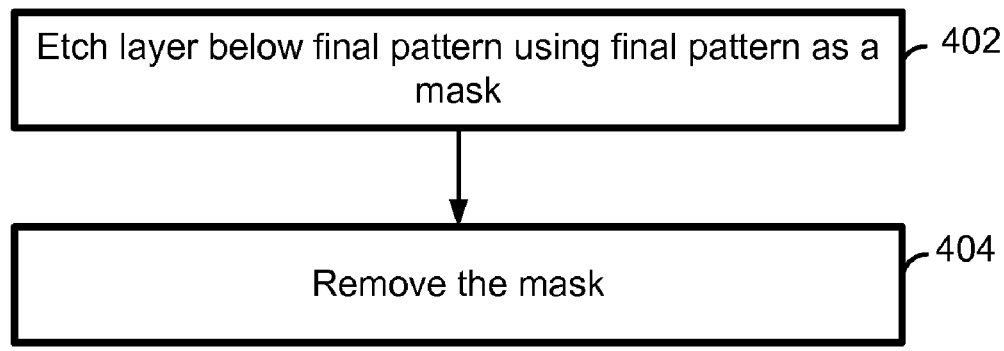
FIG. 4A is a flowchart of steps of a process of forming features using the final pattern as a mask.

In one embodiment, the final pattern is used to create features in layer 302. This is one implementation of either step 110 of FIG. 1 or step 216 of FIG. 2. FIG. 4A is a flowchart of steps of a process of forming features using the final pattern as a mask. In step 402, the material in layer 302 is etched using the final pattern as a mask. For example, polysilicon in layer 302 is etched using a silicon nitride mask.

After etching layer 302, the mask may be removed in step 404. For example, the silicon nitride mask is etched away using known techniques. FIG. 3K depicts results of using the final pattern as a mask to etch layer 302. As an example, layer 302 may be polysilicon which is etched to form gates of transistors. For example, polysilicon word lines for memory elements in a NAND memory array may be formed.

Figure 4B:
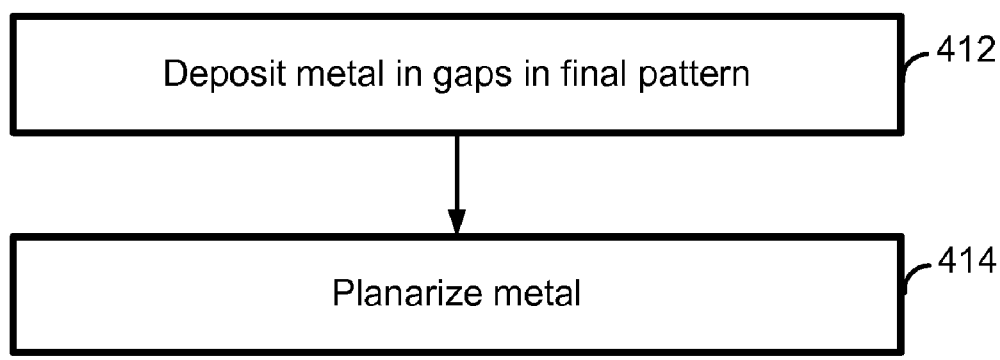
FIG. 4B is a flowchart of steps of a process of forming metal lines based on the final pattern.

As another alternative, the final pattern could be used to form metal lines. FIG. 4B is a flowchart of steps of a process of forming metal lines based on the final pattern. In step 412, metal is deposited in the spaces between the lines in the final pattern. For example, metal is deposited between silicon nitride lines. Then, chemical-mechanical polishing (CMP) may be performed to remove excess metal. Results are depicted in FIG. 3L. Specifically, alternating metal lines 317 and silicon nitride lines 319 are depicted. As one option the silicon nitride may be left in place to serve as an insulator between the metal lines. However, the silicon nitride could be removed. Then, optionally, the material at layer 302 may be etched using the metal lines as a mask. For example, polysilicon in layer 302 may be etched using the metal lines as a mask. Then, an insulator such as silicon dioxide may be added to fill in the gaps left by etching.

Figure 5:
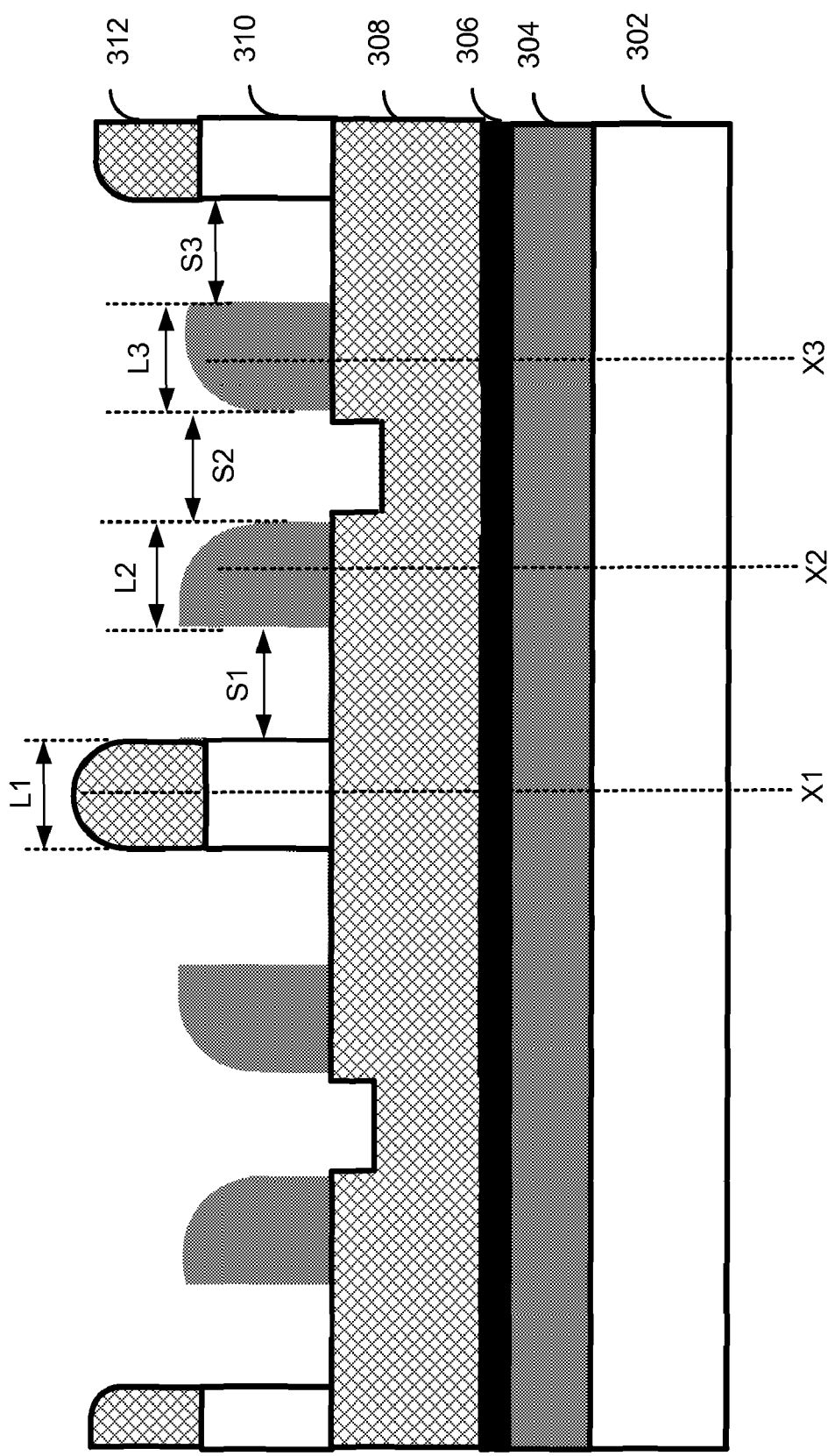
FIG. 5 is a diagram of one stage of formation of features to analyze critical dimension and overlay variations.

FIG. 5 is a diagram of one stage of formation of features to analyze critical dimension and overlay variations. In FIG. 5, L1, L2, and L3, represent the width of three lines that will be used as a mask to form lines in the final pattern. Spaces S1, S2, and S3 represent the width of three spaces that will be used when etching to form the final pattern. The locations X1, X2, and X3 represent the target center location of each the three lines in the final pattern. For purposes of illustration, an example is provided in which the target width for each of the three lines is 17 nm and the target space between each of the lines is 17 nm. Therefore, the target location of L1 is at 0, the target location of L2 is 34 nm from the center of L1 and the target location of L3 is 68 nm from the center of L1.

One possible source of error in one embodiment is in forming the first pattern in the first material in the first layer 312. For example, in step 102 the goal may be to form the first pattern with lines having a width of "W." As one specific example, the goal may be to form lines in the first material to a width of 51 nm. However, for the sake of illustration, one embodiment may have an etch bias of "a" nm. By etch bias it is meant that the deviation from the target width will be "a" nm at 3 standard deviations.

Another possible source of error in one embodiment is in reducing the width of the first material in the first layer 312. For example, in step 106 the goal may be to reduce (e.g., slim) the width of the features in the first material to ⅓ their original width. As one specific example, the goal may be to reduce lines in the first material from a width of 51 nm to 17 nm. However, for the sake of illustration, one embodiment may have a slimming and etch bias of "c". By slimming and etch bias it is meant that the deviation from the target will be "c" nm at 3 standard deviations.

Another possible source of error in one embodiment is in forming the sidewall spacers 318. For example, the goal may be for the sidewall spacers 318 to eventually have the same width as the slimmed first material. In other words, the goal may be for the sidewall spacers 318 to eventually have the same width as features in the final pattern. Note that may be some error in the thickness of the conformal layer (step 204a of FIG. 2), which may be referred to as a deposition bias. Also note that may be some error when etching the conformal layer (step 204b of FIG. 2), which may be referred to as a spacer etch bias. As one specific example, the goal may be that the sidewall spacers 318 should eventually have a width of 17 nm. However, for the sake of illustration, one embodiment may have a deposition and spacer etch bias of "b". By deposition and spacer etch bias it is meant that the deviation from the target will be "b" nm at 3 standard deviations.

Given the above, the line critical dimensions may be as follows for an example in which the target line width is 17 nm:

L1: 17−a+2c (2.2 nm)
L2: 17−b (1 nm)
L3: 17−b (1 nm)

Given the above, the spacer critical dimensions may be as follows for an example in which the target space is 17 nm:

S1: 17−c (1 nm)
S2: 17+a+2b (2.2 nm)
S3: 17−c (1 nm)

Given the above, the overlay error may be as follows:

X1: 0
X2: 34−0.5*(a+b) (0.7 nm)
X3: 68−0.5*(a+b) (0.7 nm)

The number in parenthesis above is the error assuming that each of a, b, and c are 1 nm at 3 standard deviations from the target value. Note that the error in the location of the second and third lines is only 0.7 nm in this example. Therefore, there is very little overlay variation using one embodiment of forming features using a single spacer to triple the line frequency. Also note that there is very little CD variation for lines L2 and L2, as well as for spaces S1 and S3.

Some conventional techniques that use double spacers to form features have greater overlay variation. Moreover, some conventional techniques that use double spacers to form features have greater CD variation for at least one of the spaces.

One embodiment includes a method of forming features. The method comprises the following. A first pattern having first features is formed in a first material and a second material that resides under the first material. The first material has an etch selectivity with respect to the second material. The first features in the second material have exposed sidewalls. Sidewall spacers are formed from a third material adjacent to the exposed sidewalls of the first features in the second material. The third material has an etch selectivity with respect to both the first material and the second material. The width of the first features in the first pattern in the first material is reduced. For example, the width is reduced to about the target width of features in a final pattern. The width of the first features in the first pattern in the second material is reduced using remaining portions of the first material as a mask. A second pattern is formed having second features based on remaining portions of the second material and the sidewall spacers. For example, the second pattern has three lines for each line in the first pattern. The width of lines in the second pattern may be ⅓ the width of lines in the first pattern. The pitch of lines in the first pattern may be ⅓ the pitch of lines in the first pattern.

One embodiment includes a method of forming features that includes the following. A first pattern is formed in a first material in a first layer. The first pattern has lines. The lines in the first pattern in the first material have first exposed sidewalls. The first pattern is transferred to a second material in a second layer. The first material has an etch selectivity with respect to the second material. The lines in the first pattern in the second material have second exposed sidewalls. Sidewall spacers are formed from a third material adjacent to the second exposed sidewalls. The third material has an etch selectivity with respect to both the first material and the second material. The exposed sidewalls of the first material are etched to reduce the width of lines in the first pattern in the first material to a target width for features in a second pattern. The second material is etched using portions of the first material that remain after etching the exposed sidewalls of the first material as a mask. An intermediate pattern is formed in a fourth material based on portions of the second material that remain after etching the second material and the sidewall spacers. The intermediate pattern has three lines for each line in the first pattern. Features are then formed based on the intermediate pattern.

One embodiment is a method of forming features that includes the following. A first layer of a first material, a second layer of a second material, a third layer, and a fourth layer are formed. The first layer is over the second layer; the second layer is over the third layer; and the third layer is over the fourth layer. The first layer and the second layer are etched to form a first pattern having lines. The first material has exposed sidewalls and the second material has exposed sidewalls after the etching. Sidewall spacers are formed of a third material adjacent to the exposed sidewalls of the second material. The exposed sidewalls of the first material are etched to reduce the width of the lines in the portion of the first pattern in the first layer. The second material in the second layer is etched based on portions of the first material that remain after etching the exposed sidewalls of the first material to reduce the width of the lines in the portion of the first pattern in the second layer. A fourth material in the third layer is etched based on the sidewall spacers and portions of the second material that remain after etching the second material. A fifth material in the fourth layer is etched based on portions of the fourth material that remain after etching the fourth material. A second pattern is formed based on portions of the fifth material that remain after etching the fifth material.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method of forming features, the method comprising:
   forming a first pattern having first features in a first material and a second material that resides under the first material, the first material having an etch selectivity with respect to the second material, the first features in the second material having exposed sidewalls;
   forming sidewall spacers from a third material adjacent to the exposed sidewalls of the first features in the second material, the third material having an etch selectivity with respect to both the first material and the second material;
   reducing the width of the first features in the first pattern in the first material;
   reducing the width of the first features in the first pattern in the second material using remaining portions of the first material as a mask; and
   forming a second pattern having second features based on remaining portions of the second material and the sidewall spacers.

2. The method of claim 1 wherein forming the second features includes:
   etching a fourth material based on the remaining portions of the second material and the sidewall spacers, the fourth material having an etch selectivity with respect to both the second material and the third material.

3. The method of claim 2 wherein forming the second pattern having second features includes:
   forming the second pattern based on portions of the fourth material that remain after etching the fourth material.

4. The method of claim 3, wherein the first material is carbon, the second material is polysilicon, the third material is silicon nitride.

5. The method of claim 4, wherein the fourth material is carbon.

6. The method of claim 1, wherein the first features include first lines having a first width, the second features include second lines have a second width that is approximately ⅓ the first width.

7. The method of claim 1, wherein forming the second pattern includes forming three lines in the second pattern for each line in the first pattern.

8. The method of claim 1, wherein reducing the width of the first features in the first pattern includes reducing the width of the first features to approximately the width of the second features.

9. The method of claim 1, wherein forming the sidewall spacers includes forming spacers having approximately the width of the second features.

10. A method of forming features, the method comprising:
    forming a first pattern in a first material in a first layer, the first pattern having lines, lines in the first pattern in the first material having first exposed sidewalls;
    transferring the first pattern to a second material in a second layer, the first material having an etch selectivity with respect to the second material, lines in the first pattern in the second material having second exposed sidewalls;
    forming sidewall spacers from a third material adjacent to the second exposed sidewalls, the third material having an etch selectivity with respect to both the first material and the second material;
    etching the first exposed sidewalls of the first material to reduce the width of the lines in the first pattern in the first material to a target width of for lines in features in a second pattern;
    etching the second material using portions of the first material that remain after etching the first exposed sidewalls of the first material as a mask;
    forming an intermediate pattern in a fourth material based on portions of the second material that remain after etching the second material and the sidewall spacers, the intermediate pattern having three lines for each line in the first pattern; and
    forming the second pattern having the features based on the intermediate pattern.

11. The method of claim 10, wherein etching the first exposed sidewalls of the first material includes reducing with width of lines in the first material to approximately ⅓ the width of the lines in the first pattern.

12. The method of claim 10, wherein forming the sidewall spacers includes forming sidewall spacers having approximately ⅓ the width of the lines in the first pattern.

13. The method of claim 10, wherein the first material is amorphous carbon, the second material is polysilicon, the third material is silicon nitride, the fourth material is amorphous carbon.

14. A method of forming features, the method comprising:
    forming a first layer of a first material, a second layer of a second material, a third layer, and a fourth layer, the first layer is over the second layer, the second layer is over the third layer, the third layer is over the fourth layer;
    etching the first layer and the second layer to form a first pattern having first lines, the first material having first exposed sidewalls, the second material having second exposed sidewalls;
    forming sidewall spacers of a third material adjacent to the second exposed sidewalls of the second material;
    etching the first exposed sidewalls of the first material to reduce the width of the first lines in the portion of the first pattern in the first layer to a target width for second lines in a second pattern;
    etching the second material in the second layer based on portions of the first material that remain after etching the first exposed sidewalls of the first material to reduce the width of the lines in the portion of the first pattern in the second layer;
    etching a fourth material in the third layer based on the sidewall spacers and portions of the second material that remain after etching the second material;

etching a fifth material in the fourth layer based on portions of the fourth material that remain after etching the fourth material; and forming the second pattern with the second lines based on portions of the fifth material that remain after etching the fifth material.

15. The method of claim 14, wherein forming the second pattern includes forming three lines in the second pattern for each line in the first pattern.

16. The method of claim 14, wherein etching the first exposed sidewalls of the first material reduces the width of the lines in the portion of the first pattern in the first material to approximately ⅓ the size prior to etching.

17. The method of claim 14, wherein the first material is amorphous carbon, the second material is polysilicon, the third material is silicon nitride, the fourth material is amorphous carbon, the fifth material is silicon nitride.

18. The method of claim 14, wherein forming the second pattern includes depositing metal in spaces between the second lines in the second pattern.

19. The method of claim 18, wherein the metal lines have a width that is approximately ⅓ the width of lines in the first pattern, there are three metal lines for each line in the first pattern.

20. The method of claim 14, wherein forming the second pattern includes etching a sixth material based on the second pattern, the sixth material resides below the fifth material.

* * * * *